United States Patent [19]
Efland et al.

[11] Patent Number: 6,137,140
[45] Date of Patent: Oct. 24, 2000

[54] INTEGRATED SCR-LDMOS POWER DEVICE

[75] Inventors: Taylor Rice Efland, Richardson; Stephen C. Kwan, Plano; Kenneth G. Buss, Dallas; Chin-Yu Tsai, Plano, all of Tex.

[73] Assignee: Texas Instruments Incorporated, Dallas, Tex.

[21] Appl. No.: 09/196,826

[22] Filed: Nov. 20, 1998

Related U.S. Application Data

[60] Provisional application No. 60/066,670, Nov. 26, 1997.

[51] Int. Cl.[7] .............................. H01L 29/76; H01L 29/74
[52] U.S. Cl. ......................... 257/343; 257/141; 257/162; 257/173; 257/139
[58] Field of Search ................................... 257/343, 141, 257/162, 173, 139, 341

[56] References Cited

U.S. PATENT DOCUMENTS

| | | | |
|---|---|---|---|
| 4,928,155 | 5/1990 | Nakagawa et al. | 257/139 |
| 5,773,852 | 6/1998 | Han et al. | 257/139 |
| 5,777,365 | 7/1998 | Yamaguchi et al. | 257/347 |
| 5,905,288 | 5/1999 | Ker | 257/355 |
| 5,925,900 | 7/1999 | Amaratunga et al. | 257/147 |

FOREIGN PATENT DOCUMENTS 5-283622  10/1993  Japan ............................. H01L 27/06

*Primary Examiner*—Tom Thomas
*Assistant Examiner*—Shouxiang Hu
*Attorney, Agent, or Firm*—Jacqueline J. Garner; W. James Brady, III; Frederick J. Telecky, Jr.

[57] ABSTRACT

An integrated SCR-LDMOS device (10) having a p+ region (13) in the drain region (12), but otherwise similar to a conventional LDMOS transistor. The device (10) may be implemented as a modification of a non-planar LDMOS (FIGS. 1 and 2). An alternate embodiment, device (30), may be implemented as a modification of a planar LDMOS (FIG. 3). In either case, the added p+ region (13, 37) provides the device (10, 30) with two parasitic bipolar transistors in an SCR configuration (FIGS. 4A and 4B).

14 Claims, 4 Drawing Sheets

FIG. 1

INTEGRATED SCR-LDMOS POWER DEVICE

This application claims priority under 35 USC § 119 (e)(1) of provisional application Ser. No. 60/066,670, filed Nov. 26, 1997.

TECHNICAL FIELD OF THE INVENTION

This invention relates to semiconductor devices, and more particularly, to an LDMOS (lateral double-diffused metal oxide semiconductor) device having an integrated SCR (silicon controlled rectifier).

BACKGROUND OF THE INVENTION

DMOS devices are "double diffused" MOS (metal oxide semiconductor) transistor devices. A DMOS device is characterized by a source region and a backgate region, which are diffused at the same time. The transistor channel is formed by the difference in the two diffusions, rather than by separate implantation. DMOS devices have the advantage of decreasing the length of the channel, thereby providing low-power dissipation and high-speed capability.

DMOS devices may have either lateral or vertical configurations. A DMOS device having a lateral configuration (referred to herein as an LDMOS), has its source and drain at the surface of the semiconductor wafer. Thus, the current is lateral.

In general, desired characteristics of an LDMOS are a high breakdown voltage, BV, and a low specific on-resistance (Rsp). For many applications, it would also be desirable to have an LDMOS that provides electrostatic discharge (ESD) protection. Examples of such applications are print head drivers for printers and electronic braking systems for automobiles.

Existing approaches to ESD protection for LDMOS devices are based on the addition of a protection device to the LDMOS circuit. The protection device is often larger than the LDMOS device being protected.

SUMMARY OF THE INVENTION

One aspect of the invention is an integrated SCR-LDMOS device. The device is formed on a p type semiconductor layer. A deep n-well is formed in the semiconductor layer and contains the device. A D-well is formed in the n-well. An n+ source region is formed in the D-well and an n+ drain region is formed in the n-well, with the source region and the drain region being spaced apart such that a channel is formed between them. A p+ backgate region is formed in the D-well adjacent the source region such that the source region separates the backgate region and the channel. A p+ anode region is formed between the drain region and the channel region. A gate oxide layer is formed over the channel and a gate is formed over at least part of the source region and the channel. The result is the formation of two parasitic bipolar transistors in an SCR configuration. Appropriate shorting connections are made so as to provide an anode-shorted and cathode-shorted SCR.

The gate oxide can be planar, as in a planar LDMOS device, or it can have thick field oxide regions, as in a non-planar device. Furthermore, the entire device could have its n type and p type conductivity reversed.

An advantage of the invention is that it may be manufactured as a simple modification of existing LDMOS device. During fabrication, the p+ anode region can be easily modified to provide a desired SCR holding current.

Also, as compared to existing LDMOS circuits having ESD protection, less additional area is required. Thus, with only a small increase in area, the integrated SCR-LDMOS device provides both power switching and ESD protection.

DETAILED DESCRIPTION OF THE INVENTION

The present invention is directed to a transistor type device that integrates an LDMOS and an SCR (silicon-controlled rectifier) in the same device. This device is is referred to herein as an SCR-LDMOS.

The SCR-LDMOS of the present invention is unlike other LDMOS circuits that have separate elements for ESD protection, such as those described in the Background. Although both types of LDMOS circuits may also be generally described as "integrated circuits", the SCR-LDMOS is truly a single device. As explained below, the SCR-LDMOS device integrates the SCR and LDMOS by using the existing npn parasitic transistor of a conventional LDMOS and providing a pnp parasitic transistor, such that the two parasitic transistors are configured as an SCR.

The SCR-LDMOS operates as a triggered SCR in the case of an ESD strike. This results in a much lower voltage across the device than when the device is operating as an LDMOS.

Figure 1:
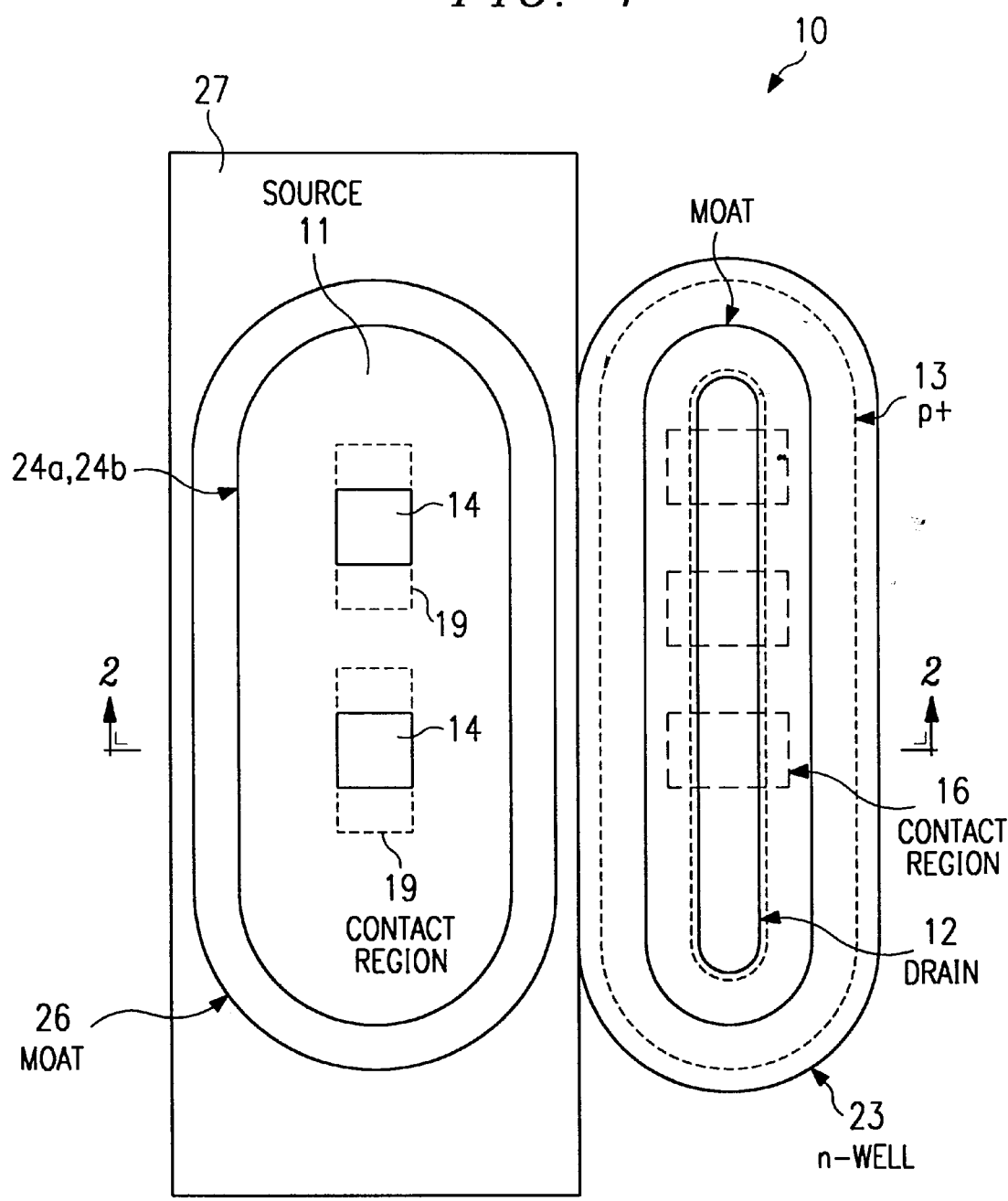
FIG. 1 is a plan view of a non-planar SCR-LDMOS device in accordance with the invention.
Figure 2:
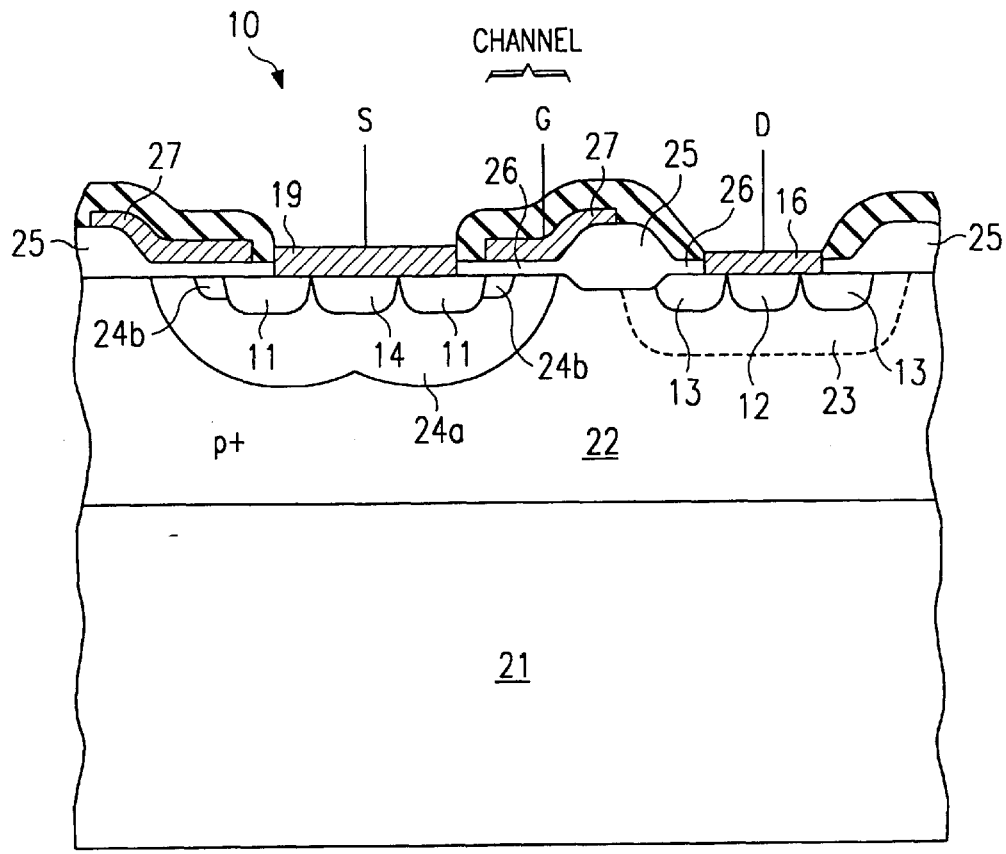
FIG. 2 is a cross sectional view along line A—A of FIG. 1.

FIG. 1 is a plan view of an SCR-LDMOS device 10 in accordance with the invention. FIG. 2 is a cross sectional view along line A—A of FIG. 1.

In the example of FIGS. 1 and 2, the LDMOS device from which SCR-LDMOS device 10 is derived is a field-oxide (non-planar) type of LDMOS device. This device is described, without the features of the present invention, in U.S. patent application Ser. No. 08/353,865, entitled "Medium Voltage LDMOS Device and Method of Fabrication", to Taylor R. Efland, et al., assigned to Texas Instruments Incorporated and incorporated herein by reference. As explained below, the invention may also be implemented as a modification of a planar LDMOS device.

Referring to both FIGS. 1 and 2, the layout is in "rings" that form alternating sources 11 and drains 12. Thus, FIGS. 1 and 2 illustrate portions of neighboring SCR-LDMOS devices as well as a complete SCR-LDMOS device 10. This type of layout is for fabrication efficiency and other patterns could be used so long as the structure of the device 10 of FIG. 2 is achieved.

Referring specifically to FIG. 2, device 10 is fabricated on a silicon substrate 21 of a first conductivity type. In the example of this description, the first conductivity type for the substrate 21 is assumed to be a p type, as is typical for LDMOS devices. However, as is the case for MOS devices in general, the use of p and n type semiconductor regions may be reversed. In general, reference can be made to a p type semiconductor region as having a first conductivity and an n type semiconductor region as having a second conductivity, or vice versa.

Then, a deep n-well 22 of a second conductivity type is diffused on substrate 21. As is the case with conventional LDMOS transistors, the device 10 is fabricated inside this n-well 22. The n-well 22 is a high voltage, low concentration, deep diffusion well that isolates the devices that may be formed on the same semiconductor wafer.

A shallow n-well 23 is then formed as the basis for a low resistance drain region. N-well 23 is optional.

A p type and n type dopant are diffused at the same time to create a double-diffused well (Dwell) having two regions, 24a and 24b, which form the basis of the source and channel for each device 10. As stated in the Background, a characteristic of an LDMOS is that its channel is formed as the difference in lateral diffusions of the two co-implanted regions 24a and 24b.

A ring-shaped thick field oxide region 25 separates the source 11 and drain 12 of each transistor 10. A thin gate oxide region 26 is grown, and a polysilicon gate region 27 is deposited and etched.

Next, n+ regions are patterned and implanted to form source regions 11 and drain region 12. As illustrated in the layout view of FIG. 1, these regions 11 and 12 may be ring-shaped. However, their relationship is best illustrated in FIG. 2, which illustrates the channel region that separates them as well as the placement of source region 11 in the D-well formed by regions 24a and 24b.

A feature of the invention is a p+ region 13 that is patterned and formed near the drain region 12, between the channel and the drain region 12. This is an "extra" region and in the embodiment of FIGS. 1 and 2, is added to what would otherwise be a conventional non-planar LDMOS transistor. As explained below, p+ region 13 provides an SCR anode, and is also referred to herein as anode region 13.

If an n-well 23 has been provided, p+ region 13 is in this n-well 23. In the example of this description, p+ region 13 is patterned as a ring that surrounds the drain region 12. However, in other embodiments, p+ region 13 might be formed only on the channel side of drain region 12. Furthermore, although forming p+ region 13 so that it touches drain region 12 facilitates shorting their contacts in the manner described below, p+ region 13 could be spaced from drain region 12. For fabrication convenience, the p+ region 13 may be self-aligned to the field oxide regions 25.

A p+ backgate region 14 is formed within the source region 11. It may be patterned and formed at the same time as p+ region 13.

In the source region 11, contact regions 19 overlay and short together the n+ regions of sources 11 and the p+ regions of backgates 14. Similarly, in the drain region 12, contact regions 16 overlay and short the n+ regions of drains 12 and the p+ regions 13. These contact regions 19 and 16 are outlined with dotted lines in FIG. 1. As illustrated in FIG. 2, they are openings that receive metalization for source and drain contacts.

In this manner, the SCR-LDMOS device 10 may be fabricated as a modification of an LDMOS device, to which a ring of p+ 13 is added to act as an SCR anode. The LDMOS source 11 acts as an SCR cathode.

Apart from the p+ ring 13 and contact regions 19 and 16, the fabrication of SCR-LDMOS may be the same as described in U.S. patent Ser. No. 08/353,865, incorporated by reference above. The formation of the p+ ring 13 may implemented as simply as modifying the pattern used for the p+ backgates 14. The contacting regions 19 and 16 are formed by conventional means for providing openings for subsequent metal contact layers.

Figure 3:
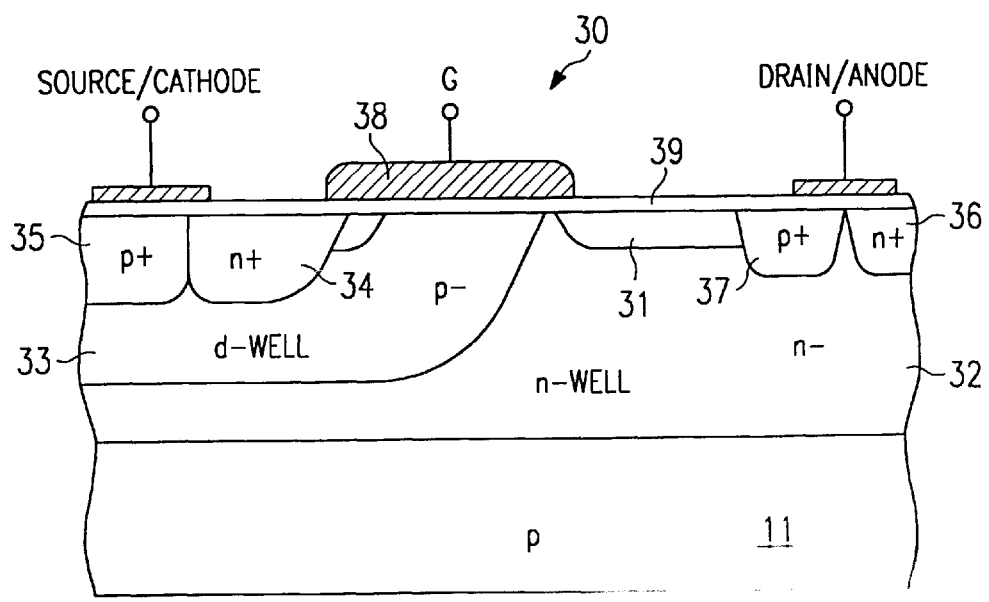
FIG. 3 is a cross sectional view of a planar SCR-LDMOS device in accordance with the invention.

FIG. 3 illustrates an SCR-LDMOS 30 formed using planar LDMOS fabrication techniques. A planar LDMOS, with a special reduced surface drain region, is described in U.S. patent Ser. No. 60/047,474, entitled "Reduced Surface Drain (RSD) LDMOS Power Device, to Chin-Yu Tsai, et al., assigned to Texas Instruments and incorporated herein by reference. Like device 10, device 30 has a substrate 11, n-well 32, Dwell 33, source region 34, backgate region 35, drain region 36, p+ (anode) region 37, and gate 38. The SCR-LDMOS device 30 lacks the thick field oxide regions of SCR-LDMOS device 10—instead a planar gate oxide layer 39 is formed across device 10. As with the p+ region 13 of device 10, p+ region 33 forms an SCR anode. The reduced surface drain region 31 is optional.

Figure 4A:
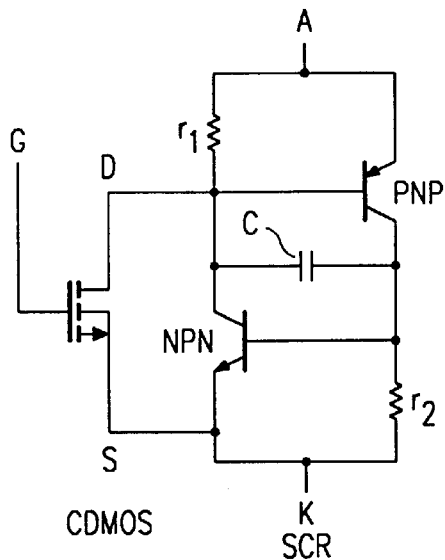
FIG. 4A is a schematic representation of the SCR-LDMOS device using the same cross sectional view as FIG. 2.
Figure 4B:
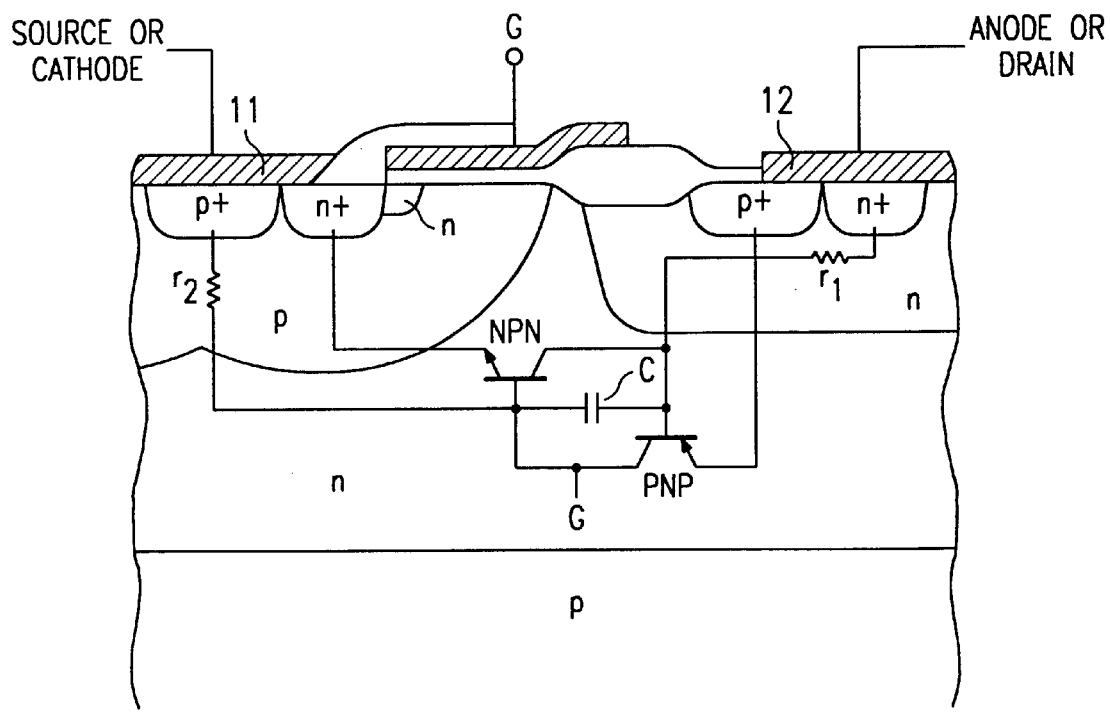
FIG. 4B illustrates how the schematic of FIG. 4A is derived.

FIG. 4A is a schematic representation of SCR-LDMOS device 10 using the same cross sectional view as FIG. 2. FIG. 4B illustrates how the schematic of FIG. 4A is derived.

Referring to both FIGS. 4A and 4B, the SCR circuit of device 10 is formed between the n+ source 11, which acts as the cathode, and the p+ region 13, which acts as the anode. The SCR circuit is formed by a set of pnp regions and a set of npn regions having a shared base/collector junction. The npn regions and pnp regions are bipolar transistor circuits and may be referred to as "parasitic transistors" of device 10. Their bases are shorted to their respective emitters. In effect, the SCR of device 10 is an anode-shorted and cathode-shorted SCR.

The SCR circuit also has two resistors, R1 and R2, referred to herein as "shorting resistors", and a capacitance, C. The SCR holding current is high because the shorting resistors are small. As with conventional SCR circuits, this holding current is the current that maintains the conducting state (latchup) of the SCR once it is triggered.

The SCR connections are made by metal, however, it is also known that parasitic resistance under the SCR regions can act as localized base biasing and can lead to the turn-on of the parasitic transistors. Here, the parasitic npn is used in conjunction with a parasitic pnp to create a rate-triggered SCR. This mode of firing occurs when a large voltage spike occurs across the device in a short amount of time, an occurrence known as dv/dt or "rate" triggering. This mode of triggering is caused by the rise in displacement current created by the relation, $$C\, dv/dt,$$

where C is the collector capacitance. The sum of the a's of the two transistors can be greater than one and the SCR will trigger. In other words, if al $\alpha 1+\alpha 2>1$, then the SCR will trigger.

For ESD application, the SCR should have a holding current that is greater than the normal LDMOS switching operation. If this condition is met, then the SCR will be off during normal operation of LDMOS switching. The SCR will turn on and protect transistor 10 when an ESD strike occurs.

The SCR holding current can be controlled to some extent by changing the contacting methods and by changing the value of the parasitic resistors, R1 and R2. Generally, the resistance, R2, on the cathode side of the SCR is not changed and is a function of the LDMOS device. This resistance is responsible for the turn-on of the parasitic npn transistor.

Figure 5A:
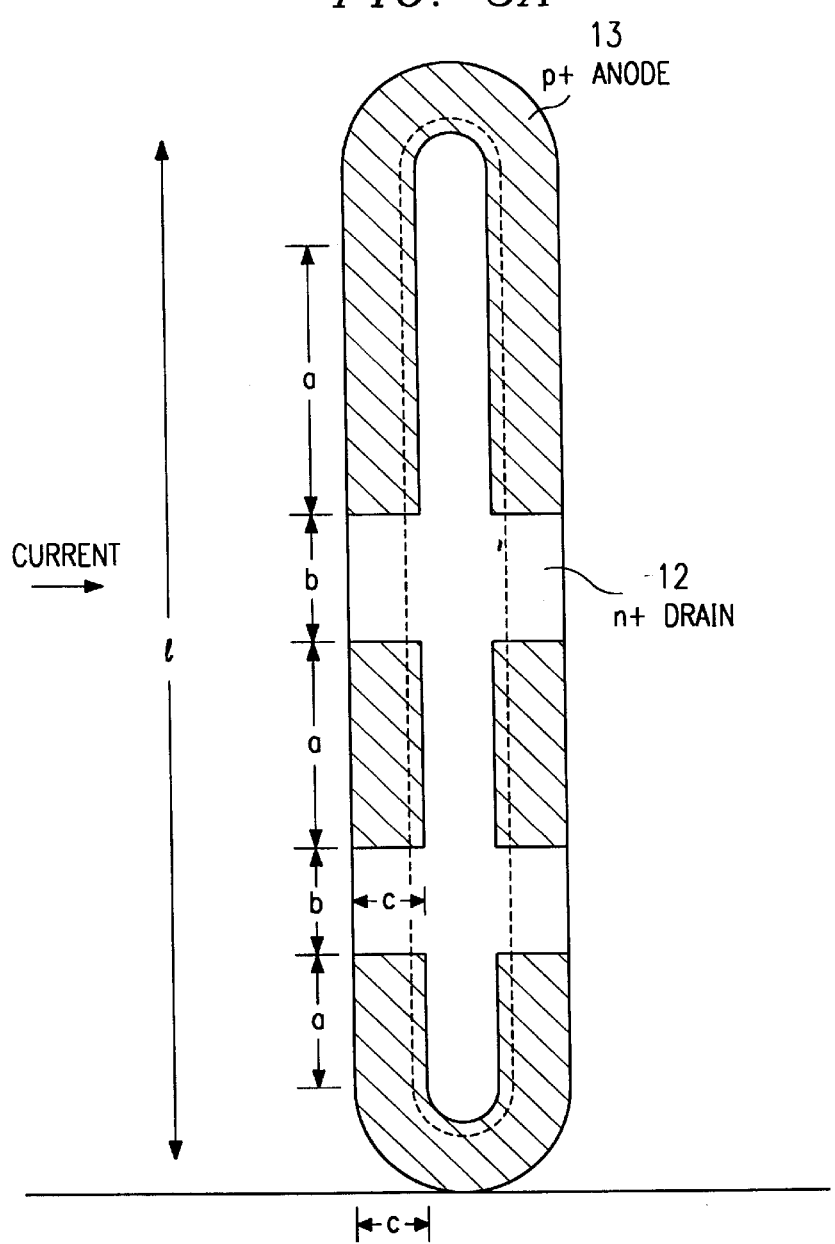
FIG. 5A illustrates a first method of fabricating the SCR-LDMOS for a specified SCR holding current.

However, as illustrated in FIG. 5A, the resistance, R1, on the anode/drain side of the SCR-LDMOS device 10 may be modified. This is accomplished by varying the ratio of p+ to n+ exposed along the current boundary, 1, that separates the source/cathode region of device 10 from the drain/anode region. In FIG. 5A, the p+ region 13 is illustrated as having separations along this boundary, 1. Within these separations, a contacting pattern for the n+ drain 12 is patterned.

By changing the ratio of the p+ boundary (a) to the n+ boundary (b), the resistance of R1 can be changed. An increase in the n+ boundary (b) decreases R1 by creating shorting paths to the contact of the anode/drain 12. More specifically, the exposed n+ regions (b) act as shorting paths so that the current can flow through a low-resistance high-concentration region rather than under the p+ region 13 in a relatively high-resistance low-concentration region. This lowers the resistance and at the same time permits less current to flow through the resistance, which lowers the voltage drop across the shorted anode. Thus, more current is required to trigger the SCR and the holding current is higher.

Figure 5B:
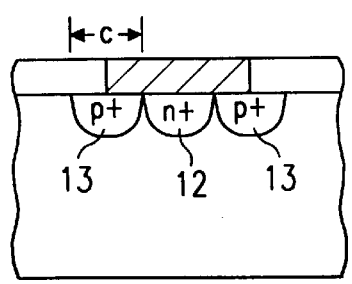
FIG. 5B illustrates a second method of fabricating the SCR-LDMOS for a specified SCR holding current.

FIGS. 5A and 5B illustrate an alternative method of varying the resistance, R1. This method involves changing the width, c, of the patterned p+ region 13. The resistance, R1, is directly proportional to the distance through which the current flows. Expressed mathematically, $$R1 \propto c/a$$

As c increases so does R1. Thus, widening c (the width of the p+ region 13) will increase the resistance and lower the holding current.

As described in the preceding two paragraphs, the invention provides two methods of controlling R1. The result is a dual method of controlling the holding current of the SCR.

An SCR-LDMOS device 10 or 30 in accordance with the invention has a slightly increased Rsp (specific on-resistance), where $$Rsp = Ron \times area$$

This is because the pitch that defines the area of device 10 is increased to accommodate the p+ ring 13. The Ron is also slightly increased because the current flows under the p+ region 13 to reach the drain 12. For a typical 40 volt SCR-LDMOS device 10 or 30, the Rsp is increased approximately 20% as compared to a conventional LDMOS. However, this compares favorably with an LDMOS having a separate ESD structure, whose contribution to the device area would result in a Rsp increase of approximately 40%.

Other Embodiments

Although the present invention has been described in detail, it should be understood that various changes, substitutions and alterations can be made hereto without departing from the spirit and scope of the invention as defined by the appended claims.

What is claimed is:

1. An integrated SCR-LDMOS device, comprising:
   a semiconductor layer of a first conductivity type;
   a second region of a second conductivity type opposite said first conductivity type formed as a well in said semiconductor layer;
   a third region of said first conductivity type formed as a well in said second region
   a source region of said second conductivity type formed in said third region;
   a drain region of said second conductivity type formed in said second region and spaced apart from said source region, such that a channel is formed between said source region and said drain region;
   a backgate region formed in said third region and adjacent said source region such that said source region separates said backgate region and said channel, said backgate region being of said first conductivity type;
   an anode region of said first conductivity type between said drain region and said channel region;
   a gate oxide layer over said channel; and
   a gate over at least part of said source region and said channel.

2. The device of claim 1, wherein said first conductivity type is p type and said second conductivity is n type.

3. The device of claim 1, wherein said semiconductor layer has a first sublayer having a first dopant concentration and a second sublayer having a second dopant concentration less than said first dopant concentration.

4. The device of claim 1, wherein said source region has a dopant concentration greater than that of said second region.

5. The device of claim 1, wherein said drain region has a dopant concentration greater than that of said second region.

6. The device of claim 1, wherein said second region is a low dopant concentration high-voltage region.

7. The device of claim 1, wherein said third region is a low dopant concentration region.

8. The device of claim 1, wherein said gate oxide layer is planar over said device.

9. The device of claim 1, wherein said gate oxide layer has thick field oxide regions between said channel and said drain region.

10. The device of claim 1, wherein said anode region touches said drain region.

11. The device of claim 1, further comprising shorting contacts between said source region and said backgate region and shorting contacts between said drain region and said anode region.

12. The device of claim 1, further comprising a well of said second conductivity type in which said drain region and said anode region are formed.

13. The device of claim 1, wherein said anode region has gaps such that current from said channel region to said drain region may flow through said gaps.

14. The device of claim 1, wherein said anode region has a predetermined width that determines the distance that current flows from said channel region to said drain region.

* * * * *